(12) United States Patent
Marquart

(10) Patent No.: US 8,199,585 B2
(45) Date of Patent: Jun. 12, 2012

(54) DYNAMIC SOFT PROGRAM TRIMS

(75) Inventor: Todd Marquart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/079,643

(22) Filed: Apr. 4, 2011

(65) Prior Publication Data

US 2011/0182122 A1 Jul. 28, 2011

Related U.S. Application Data

(63) Continuation of application No. 12/371,294, filed on Feb. 13, 2009, now Pat. No. 7,920,427.

(51) Int. Cl.
*G11C 16/04* (2006.01)
(52) U.S. Cl. ........... 365/185.29; 365/185.3; 365/185.22; 365/218; 365/199; 365/185.19
(58) Field of Classification Search ............. 365/185.29, 365/185.3, 185.22, 218, 199, 185.19
See application file for complete search history.

(56) References Cited

U.S. PATENT DOCUMENTS

| | | | |
|---|---|---|---|
| 5,680,350 A | 10/1997 | Lee | |
| 6,240,023 B1 | 5/2001 | Roohparvar | |
| 6,515,909 B1 | 2/2003 | Wooldridge | |
| 7,082,060 B2 | 7/2006 | Roohparvar | |
| 7,180,781 B2 | 2/2007 | Abedifard | |
| 7,292,476 B2 | 11/2007 | Goda | |
| 7,408,810 B2 | 8/2008 | Seiichi | |
| 7,656,712 B2 | 2/2010 | Lisi et al. | |
| 2008/0008006 A1 | 1/2008 | Goda | |
| 2008/0291730 A1 | 11/2008 | Seiichi | |
| 2009/0003078 A1 | 1/2009 | Mihnea | |
| 2010/0128525 A1* | 5/2010 | Mokhlesi | 365/185.03 |

* cited by examiner

*Primary Examiner* — Thong Q Le
(74) *Attorney, Agent, or Firm* — Fletcher Yoder

(57) ABSTRACT

Systems and methods are disclosed for modifying soft-programming trims of a non-volatile memory device, such as a flash memory device. The soft-programming trims may be modified based on a count of erase pulses applied to memory cells of the memory device. The number of erase pulses used to erase memory cells may be indicative of accumulated charge in the memory cell. The start voltage, step size, pulse width, number of pulses, pulse ramp, ramp rate, or any other trim of the soft-programming operation may be modified in response to the number of erase pulses.

20 Claims, 4 Drawing Sheets

DYNAMIC SOFT PROGRAM TRIMS

CROSS-REFERENCE TO RELATED APPLICATION

This application is a continuation of U.S. patent application Ser. No. 12/371,294, which was filed on Feb. 13, 2009, now U.S. Pat. No. 7,920,427, which issued on Apr. 5, 2011.

FIELD OF INVENTION

The invention relates generally to memory devices and more specifically to operation of NAND flash memory devices.

DESCRIPTION OF RELATED ART

Electronic systems, such as computers, personal organizers, cell phones, portable audio players, etc., typically include one or more memory devices to provide storage capability for the system. System memory is generally provided in the form of one or more integrated circuit chips and generally includes both random access memory (RAM) and read-only memory (ROM). System RAM is typically large and volatile and provides the system's main memory. Static RAM and Dynamic RAM are commonly employed types of random access memory. In contrast, system ROM is generally small and includes non-volatile memory for storing initialization routines and identification information. Electrically-erasable read only memory (EEPROM) is one commonly employed type of read only memory, wherein an electrical charge may be used to program data in the memory.

One type of non-volatile memory that is of particular use is a flash memory. A flash memory is a type of EEPROM that can be erased and reprogrammed in blocks. Flash memory is often employed in personal computer systems in order to store the Basic Input Output System (BIOS) program such that it can be easily updated. Flash memory is also employed in portable electronic devices, such as wireless devices, because of the size, durability, and power requirements of flash memory implementations. Various types of flash memory may exist, depending on the arrangement of the individual memory cells and the requirements of the system or device incorporating the flash memory. For example, NAND flash memory is a common type of flash memory device.

A typical flash memory includes a memory array having a large number of memory cells arranged in rows and columns. The memory cells are generally grouped into blocks such that groups of cells can be programmed or erased simultaneously. Each of the memory cells may include a floating gate field-effect transistor capable of storing a charge. Floating gate memory cells differ from standard MOSFET designs in that they include an electrically isolated gate, referred to as the "floating gate," in addition to the standard control gate. The floating gate is generally formed over the channel and separated from the channel by a gate oxide. The control gate is formed directly above the floating gate and is separated from the floating gate by another thin oxide layer. A floating gate memory cell stores information by holding electrical charge within the floating gate. By adding or removing charge from the floating gate, the threshold voltage of the cell changes, thereby defining whether this memory cell is programmed or erased.

The memory array is accessed by a row decoder activating a row of memory cells by selecting the wordline connected to a control gate of a memory cell. In addition, the wordlines connected to the control gates of unselected memory cells of each string are driven to operate the unselected memory cells of each string as pass transistors, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines. To erase the contents of the memory array, a relatively high voltage is applied to the memory array such that the source and drain of the memory cells to be erased are forward biased. In other words, the threshold voltage of the cell may be reduced such that the cell is on during a read operation.

As NAND memory blocks are cycled (e.g., erased and programmed), erase time and programming time may alter. For example, erase time may increase and programming time may decrease due to the accumulation of trapped charge in the floating gate. Some memory devices may include a technique referred to as "soft-programming." A soft-programming operation is designed to correct the threshold voltage, such as after an erase operation. However, soft-programming operations are typically set during programming of the memory device and remain unchanged over the life of the device. The performance and effectiveness of a soft-programming operation may vary as the memory device is used and the memory cells of the memory device are cycled.

DETAILED DESCRIPTION

Figure 1:
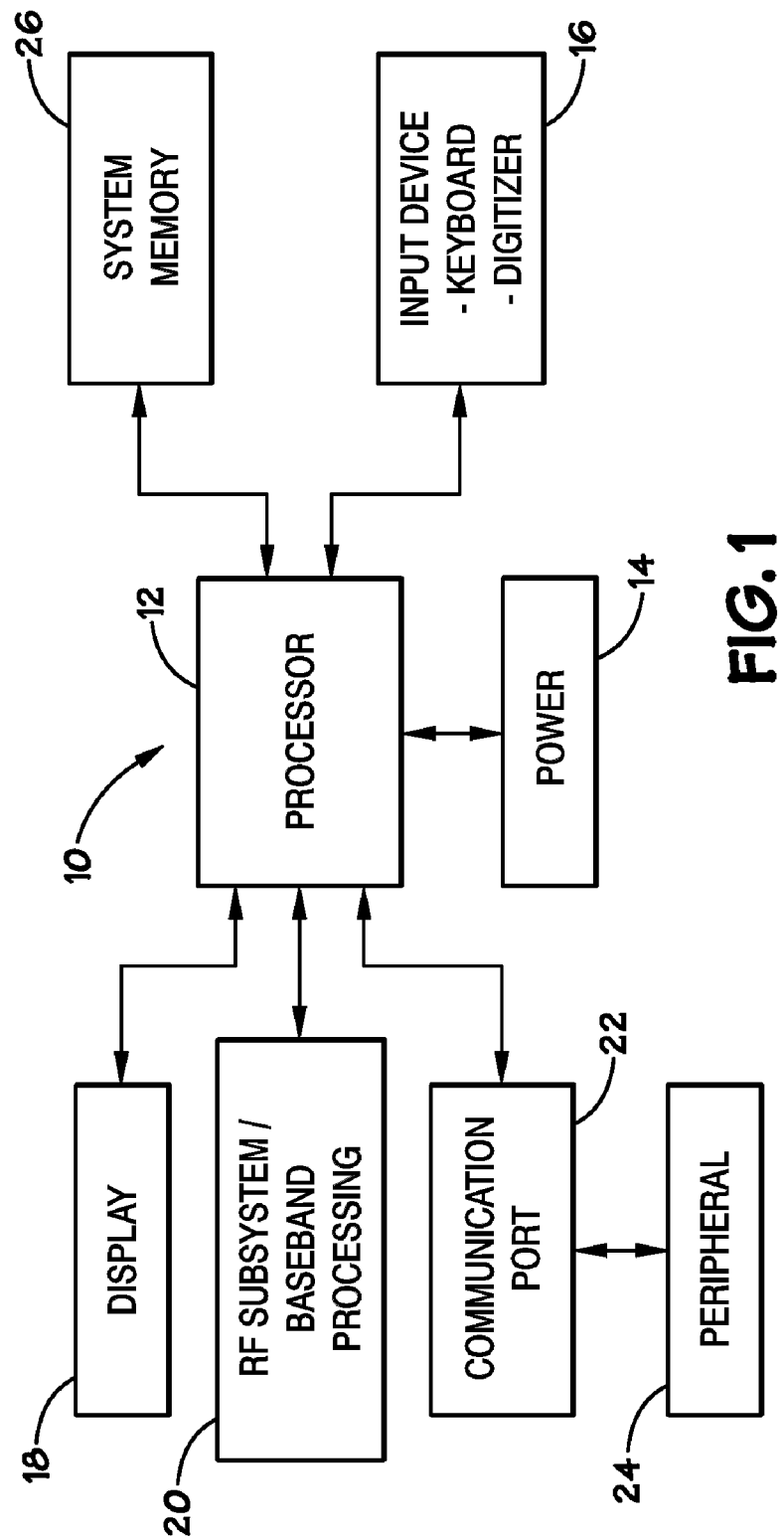
FIG. 1 is a block diagram that illustrates a processor-based device having a memory that includes memory devices fabricated in accordance with one or more embodiments of the present invention.

Turning now to the drawings, and referring initially to FIG. 1, a block diagram depicting an embodiment of a processor-based system, generally designated by reference numeral 10, is illustrated. The system 10 may be any of a variety of types such as a computer, pager, cellular phone, personal organizer, portable audio player, control circuit, camera, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a stylus, a mouse, and/or a voice recognition system, for instance. A display 18 may also be coupled to the processor 12. The display 18 may include an LCD, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As described further below, the system memory 26 may include one or more memory devices, such as flash memory devices, that may include a floating gate memory array fabricated in accordance with embodiments of the present invention.

Figure 2:
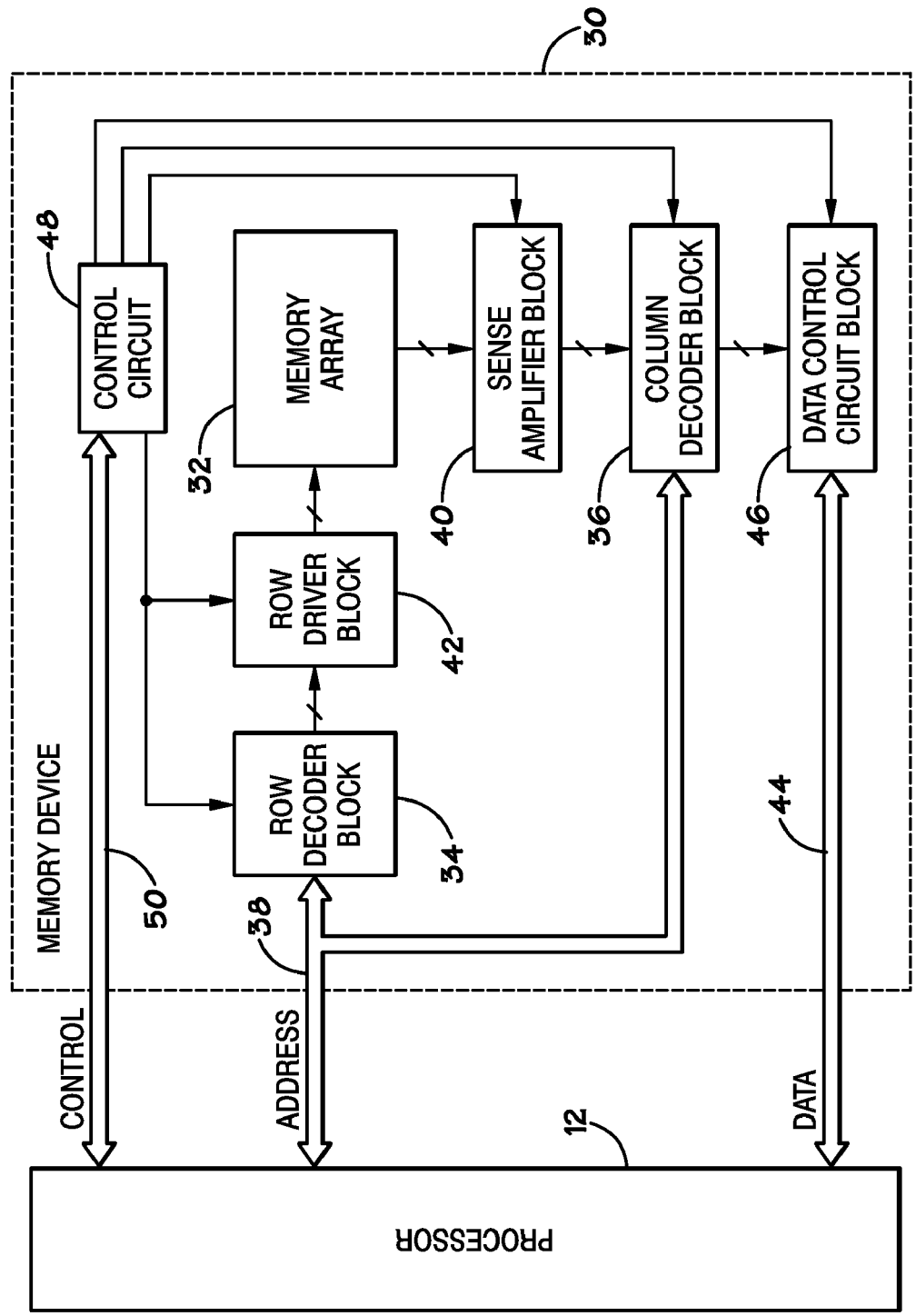
FIG. 2 is a block diagram that illustrates a memory device having a memory array fabricated in accordance with one or more embodiments of the present invention.

FIG. 2 is a block diagram illustrating a flash memory device, e.g., NAND flash memory device 30 that may be included as a portion of the system memory 26 of FIG. 1. The flash memory device 30 generally includes a memory array 32. The memory array 32 generally includes many rows and columns of conductive traces logically arranged in a grid pattern to form a number of memory cells. The lines used to select cells in the memory array 32 are usually considered the rows or "row lines," and are generally referred to as "wordlines." The lines used to access (e.g., read) the cells are usually referred to as the columns or "column lines," and are generally referred to as "bit lines" or "digit lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 to access a particular memory cell in the memory array 32. A sense amplifier block 40 having a plurality of the sense amplifiers is also provided between the column decoder 36 and the memory array 32 to sense and amplify individual values stored in the memory cells. Further, a row driver block 42 is provided between the row decoder block 34 and the memory array 32 to activate a selected word line in the memory array according to a given row address.

During read and program operations, such as a write operation, data may be transferred to and from the flash memory device 30 via the data bus 44. The coordination of the data and address information may be conducted through a data control circuit block 46. Finally, the flash memory device 30 may include a control circuit 48 configured to receive control signals from the processor 12 via the control bus 50. The control circuit 48 is coupled to each of the row decoder block 34, the column decoder block 36, the sense amplifier block 40, the row driver block 42 and the data control circuit block 46, and is generally configured to coordinate timing and control among the various circuits in the flash memory device 30.

The memory device 30 may be configured to execute various operations on the memory array 32, such as by the control circuit 48. For example, the memory device may execute a soft programming operation after an erase operation to achieve a modified threshold voltage distribution among memory cells of the memory array 32. A soft-programming operation may include a number of parameters (also referred to as "trims") that control the soft-programming signal applied to memory cells of the memory array. However, a soft-programming signal of a conventional soft-programming operation may be set during the manufacture of the memory device 30 and is not modified over the lifetime of the memory device 30.

As a result, the soft-programming operation applied to a memory cell may be too slow initially, when there is no accumulation of trapped charge in a memory cell, and may be too fast when there is some accumulation of charge in a memory cell (e.g., after a higher number of read/write cycles of the memory cells), leading to additional stress and status failure. The soft-programming operation may execute faster after higher cycle counts of a memory cell, overshooting the desired threshold voltage value and requiring a re-execution of the erase operation, the soft-programming operation, or both. These increased operations generate stress on the memory array 32 and may cause premature status failure of the device 30.

In accordance with an embodiment of the present invention, the memory device 30 may include a modified soft-programming operation after an erase operation to achieve a modified threshold voltage distribution among memory cells of the memory array 32. As mentioned above, the threshold voltages of memory cells of the memory array 32 may vary due to the accumulation of charges in the memory cells during operation of the memory device 30. Additionally, other factors may change the accumulated charge in the memory cells of the memory array 32, such as high temperatures or other external conditions, by trapping or releasing accumulated charge.

FIGS. 3A-3D are schematic diagrams illustrating operation of a subset of cells 52 of a block of the memory array 32 in accordance with an embodiment of the present invention. It should be appreciated that the cells 52 represent a selected portion of a memory array 32, and other memory cells, gates, transistors, etc., are omitted for clarity. In some embodiments, the memory cells 52 may be single-level cells, multi-level cells, or any combination thereof.

Figure 3A:
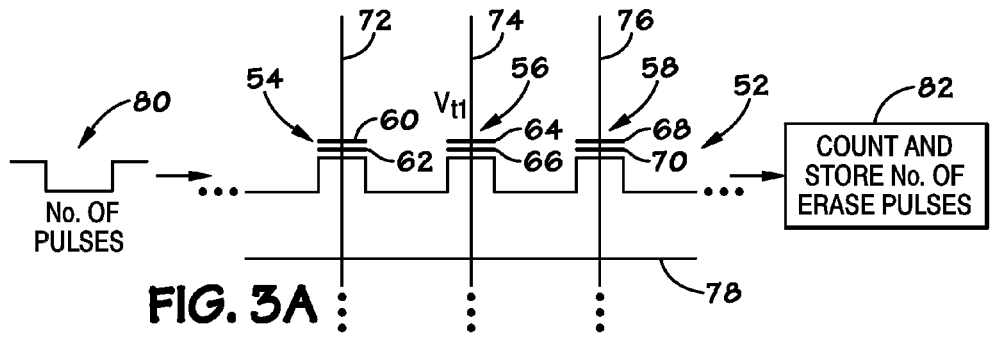
FIGS. 3A-3D are schematic diagrams of an erase and soft-program operation in accordance with an embodiment of the present invention.

FIG. 3A illustrates three memory cells 54, 56, and 58. As will be appreciated, the memory cell 54 includes a control gate 60 and floating gate 62, the memory cell 56 includes a control gate 64 and floating gate 66, and the memory cell 58 includes a control gate 68 and memory cell 70. The memory cells 54, 56, and 58 may be coupled to wordlines 72, 74, and 76 respectively. The memory cells 54, 56, 58 are also coupled to a bitline 78. It should be appreciated that the signals discussed below, and manipulation of the memory cells 54, 56, and 58, may be performed by biasing the wordlines 72, 74, and 76, and bitline 78.

In a typical embodiment, memory cell 54 may be subject to cross-coupling effects from memory cell 56, and memory cell 58 may be subject to cross-coupling effects from memory cell 56. For example, trapped electrons in the floating gate 66 of the memory cell 56 may raise the floating gate voltage (i.e., threshold voltage) to a value high enough to effect operations performed on the adjacent memory cells 54 and 58.

FIG. 3A illustrates memory cell 56 in a programmed state, such that the floating gate 66 of the memory cell 56 stores sufficient trapped charge to raise the threshold voltage of the memory cell 56 and indicate a programmed state. The memory cell 56 has a first threshold voltage ($Vt_1$), indicating that the memory cell 56 is programmed. To erase the memory cell 56 (and the block that includes the memory cells 54 and 58), an erase signal 80 may be applied to the subset of memory cells 52. In an embodiment, the erase signal 80 may be applied at a certain voltage for s number of pulses. For example, after a pulse of the erase signal 80, the threshold voltages of the memory cells 54, 56, and 58 may be verified, such as by comparing the floating gate voltage to a reference voltage, comparing the current of the memory cell to a reference current, etc. If the threshold voltage of one or more of the cells 54, 56, and 58 has not reached the desired reference voltage value, then another pulse of the erase signal 80 may be applied to the memory cells 54, 56, and 58.

The number of pulses used to erase the memory cells 54, 56, and 58 may be counted and stored, as indicated by block 82. In one embodiment, the number of pulses of the erase signal 80 may be counted and stored in a state machine, that is included in the memory device 30 (such as in the control circuit 48), or in the processor 12. The number of pulses of the erase signal used to erase the memory cells 54, 56, and 58 may be directly related the stress undergone by the memory cells 54, 56, and 58, the time in-between operations, the temperature etc. For example, such stress may include the number of cycles undergone by the memory cells 54, 56, and 58. That is, as described above, each cycle of the memory cell 54, 56, and 58 may result in the accumulation of charge in the floating gates of the memory cells 54, 56, and 58. The accumulated charge affects the number of erase pulses used to erase the memory cell 54, 56, and 58. In an older or more frequently used memory array 32, the increased number of cycles and accumulation of charge may result in an increased number of erase pulses used to erase the memory cells. In contrast, an uncycled (e.g., unstressed) memory cell may have minimal accumulation of charge, and thus may use one erase pulse to erase the memory cell. A memory array 32 may have blocks of stressed and unstressed memory cells.

Figure 3B:
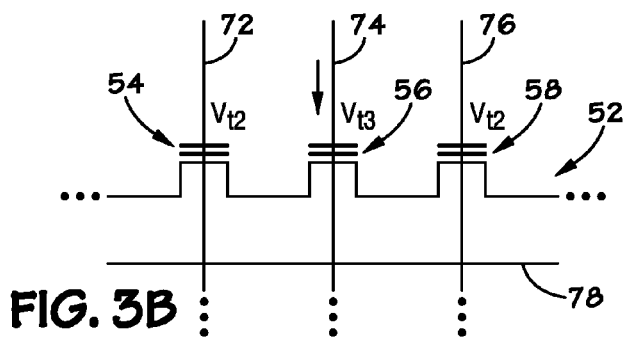

As shown in FIG. 3B, after erasing, the memory cells 54, 56, and 58 may have different threshold voltages. For example, memory cells 54 and 58 may have a threshold voltage of $Vt_2$, and memory cell 56 may have a threshold voltage of $Vt_3$. As discussed above, this difference may be due to the accumulation of trapped charge in the memory cells 54, 56, and 58, such that the erase operation affects each memory cell differently, resulting in an uneven distribution of charge. For example, some memory cells, such as memory cells 54 and 58, may be "overerased," (also referred to as a "depleted state"). Thus, the threshold voltage $Vt_2$ of memory cells 54 and 58 may be different than the threshold voltage $Vt_3$. The difference in threshold voltages may cause cross-coupled effects between the memory cell 56 and memory cells 54 and 58.

Figure 3C:
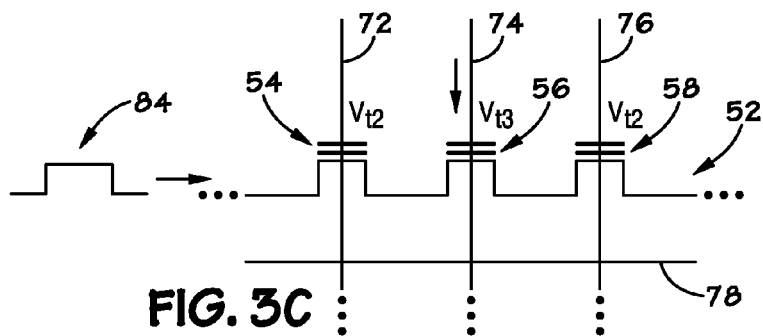

As described above, to correct the threshold voltage distribution among memory cells 54, 56, and 58 (e.g., to pull the threshold voltage $Vt_2$ of memory cells 54 and 58 up to or near the threshold voltage $Vt_3$ of memory cell 56), a modified soft-programming signal 84 may be applied to the memory cells 54 and 58, as shown in FIG. 3C. The soft-programming signal 84 may be applied at a specific voltage for any number of pulses.

The soft-programming operation may include a number of parameters (e.g., trims), that control the soft-programming signal 84. For example, the soft-programming operation parameters may include a start voltage, a step size, a pulse width, the number of pulses, pulse ramp, ramp rate, or any other suitable parameter. The soft-programming operation may modify any combination of parameters of the soft-programming signal 84 based on the count of erase pulses stored (in block 82). For example, in some embodiments, none of the parameters may be modified. In other embodiments only one of the parameters of the soft-programming signal may be modified. In other embodiments, multiple parameters of the soft-programming signal may be modified, or all of the parameters of the soft-programming signal may be modified. By correlating the parameters of the soft-programming signal 84 to the counted number of pulses of the erase signal 90, the soft-programming signal 84 may be modified to better achieve the desired threshold voltage distribution.

For example, if memory cells 54 and 58 have a relatively high amount of accumulated charge (e.g., the memory cells 54 and 58 have a high cycle count), the number of pulses of the soft-programming signal 84 may be reduced. For a different group of memory cells that may have little to no accumulated charge (e.g., in an uncycled state), the soft-programming signal 84 may be unmodified or the number of pulses may be reduced. The relationship between the parameters of the soft-programming operation and the number of pulses of the erase operation may be determined experimentally and/or theoretically, such as during manufacture and testing of the memory array 32 and/or memory device 30.

Figure 3D:
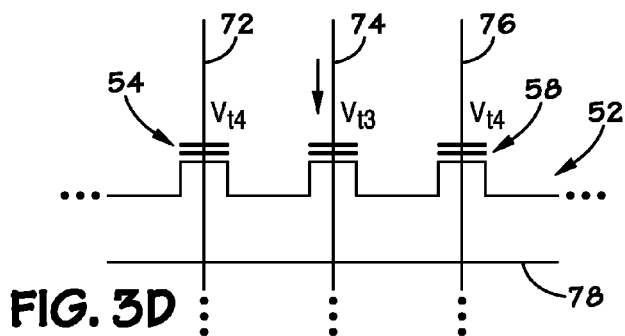

As shown in FIG. 3D, after execution of the soft-programming operation, the threshold voltages of the erased memory cells 54 and 58 are raised to a threshold voltage $Vt_4$. The threshold voltage $Vt_4$ may be closer to the threshold voltage $Vt_3$ of memory cell 74, reducing the threshold voltage distribution in the subset of memory cells 52. This threshold distribution correction reduces or eliminates any cross-coupling effects of between the memory cells 54, 56, and 58. In some embodiment, the results of the soft-programming operation may be verified, such as by comparing the threshold voltages of the memory cells 54, 56, and 58 to a reference voltage, comparing the current of the memory cells 54, 56, and 58 to a reference current, etc.

Figure 4:
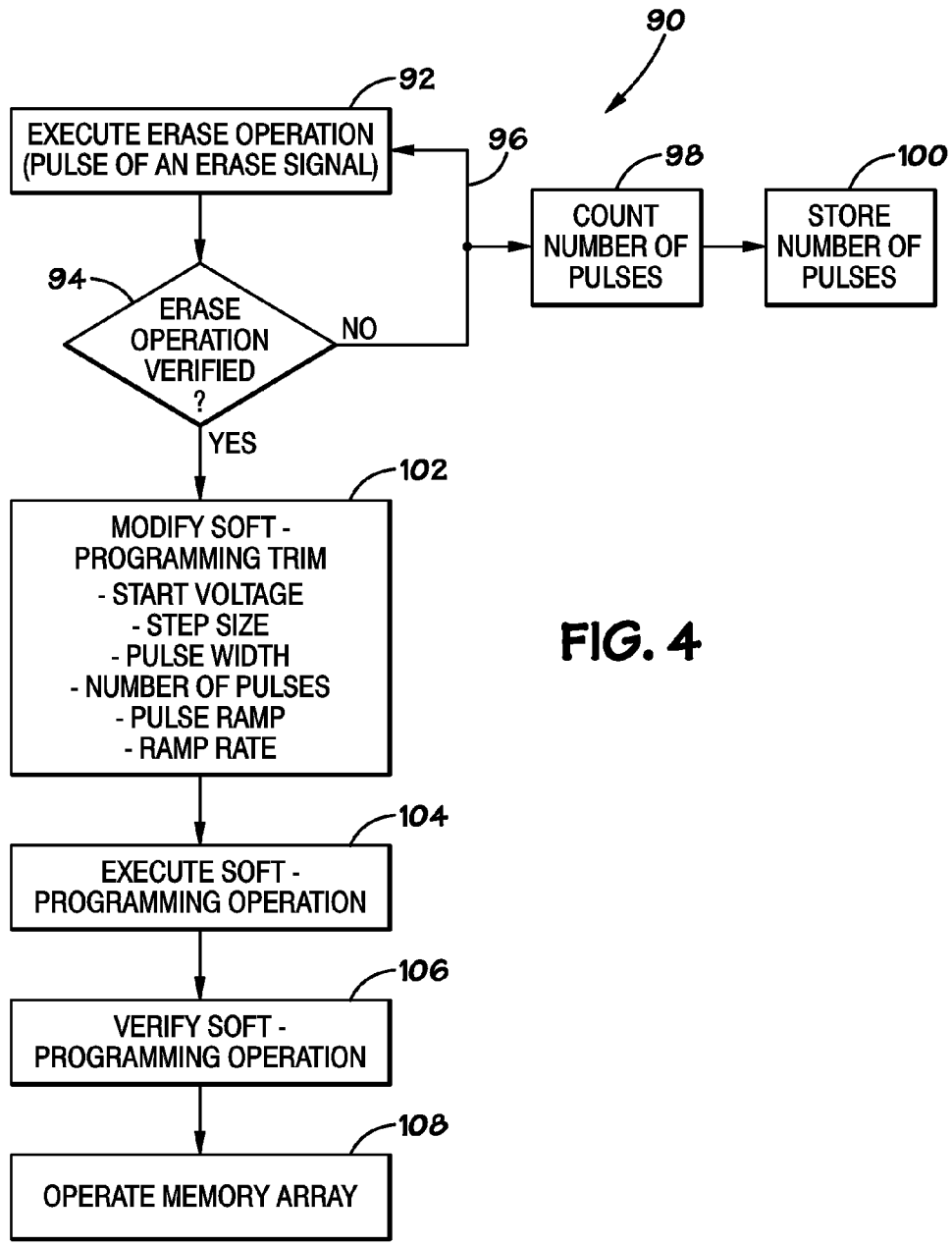
FIG. 4 is a flowchart of a process for modifying a soft-program operation in accordance with an embodiment of the present invention.

FIG. 4 illustrates a process 90 for modifying the soft-programming trims of a memory device 32 in accordance with an embodiment of the present invention. It should be appreciated that the process 90 and associated logic may be implemented in hardware, software (e.g., a tangible computer-readable medium having computer readable code), or a combination thereof. Additionally, the process 90 may be implemented in the memory device 32 (such as in the control circuit 48) or in the processor 12.

An erase operation may be performed on cells of the memory array 32 (block 92), such as on one or more blocks of the memory array 32. The erase operation may be initiated in response to a request by a user, program, and/or device accessing the memory device 30. The erase operation may apply an erase signal to memory cells of the memory array 32, as described above. It should be appreciated that the erase operation may include additional operations to ensure execution of the erase operation, such as a pre-programming operation. After a pulse of the erase signal of the erase operation, the state of the erased memory cells may be verified (decision block 94), such as by comparison of the cell to a reference voltage or reference current. If one or more of the memory cells do not meet the verification, another pulse of the erase signal may be applied to the memory cells, as indicated by arrow 96. The erase pulses may continue until the memory cells pass the verification or a predetermined number of erase pulses have been applied.

During the erase operation, the number of erase pulses used to erase the memory cells may be counted (block 98) and stored (block 100). After verification of the erased memory cells (i.e., completion of the erase operation) a soft-programming operation may be modified based on the counted number of erase pulses (block 102). As described above, the soft-programming operation may include a number of parameters (i.e., trims) of a soft-programming signal that will be applied to the memory cells. The soft-programming trims may be modified based on the counted number of erase pulses. The parameters may include, start voltage, a step size, a pulse width, the number of pulses, duration, pulse ramp, ramp rate, or any other suitable parameter. Any number of parameters may be modified, or none of the parameters may be modified. For example, the number of soft-program pulses (for a fixed start voltage) may drop as a block of memory cells is cycled. In another example, the start voltage may be related to the number of cycles experienced by a block of memory cells, and the start voltage may be modified while keeping the number of pulses (and/or duration) fixed. In such an embodiment, modifying the start voltage may reduce the soft-programming duration of an unstressed block of memory cells and reduce the chance of over-soft-programming a stressed block of memory cells.

After modification of the soft programming signal, the soft-programming signal may be applied to any number of the recently erased memory cells (block 104). In some embodiments, the result of the soft-programming operation may be verified. By executing the soft-programming operation after the erase operation, the process 90 ensures that the adjusted parameters reflect the present state of the erased memory cells. However, in other embodiments, the soft-programming operation may be executed at any duration after the erase operation, and the number of erase pulses may be stored for any duration.

The completion of the soft-programming operation may be verified, such as by comparison of the cell to a reference voltage or reference current (block 106). Further, in some embodiments, if the desired threshold voltage is not met by the soft-programming operation, the cell may be re-erased and the soft-programming modification and operation performed again. In such embodiments, the erase operation, soft-programming operation, or combination thereof, may be executed until the memory cells pass one or more verifications or a predetermined number of operations have been executed.

Additionally, as described above, the relationship between the number of erase pulses and the soft-programming trims may be determined theoretically or experimentally. For example, in some embodiments, the threshold voltage and/or current of one or more memory cells may be measured in response to erase operations and various soft-programming operations to establish a relationship between the parameters of the soft-programming signal and the number of erase pulses.

In other embodiments, the soft-programming modification may be used for any operation or process that employs a soft-programming operation. For example, a compaction operation that attempts to correct the threshold voltage distribution of a group of memory cells may use soft-programming to adjust the threshold voltages of some of the group of memory cells. In such an embodiment, the soft-programming signal of the soft-programming operation may be modified based on previous erase operations and the counted number of pulses of such operations.

What is claimed is:

1. A system comprising:
   a memory array, comprising a plurality of memory cells;
   a device configured to monitor charge accumulation in the plurality of memory cells; and
   a device configured to modify a soft-programming operation of the memory cells based on the charge accumulation in the plurality of memory cells.

2. The system of claim 1, wherein the device configured to monitor charge accumulation comprises a device configured to monitor the charge accumulation in the plurality of memory cells during an erase operation.

3. The system of claim 1, wherein the device configured to monitor charge accumulation comprises a device configured to count a number of pulses used to erase each of the plurality of memory cells.

4. The system of claim 1, wherein the system comprises a device configured to store a value corresponding to the charge accumulation in the plurality of memory cells.

5. The system of claim 4, wherein the device configured to store the value corresponding to the charge accumulation in the plurality of memory devices comprises as state machine.

6. The system of claim 4, comprising a memory device having the memory array thereon, wherein the device configured to store the value corresponding to the charge accumulation in the plurality of memory devices comprises a control circuit internal to the memory device.

7. The system of claim 4, comprising a memory device having the memory array thereon, wherein the device configured to store the value corresponding to the charge accumulation in the plurality of memory devices comprises a processor external to the memory device.

8. The system of claim 1, wherein the system comprises a device configured to store a number of pulses used to erase the plurality of memory cells, and wherein the number of pulses is indicative of the charge accumulation in the plurality of memory cells.

9. The system of claim 1, comprising a memory device having the memory array thereon, wherein the device configured to modify the soft-programming operation of the memory cells based on the charge accumulation in the plurality of memory cells comprises a control circuit internal to the memory device.

10. The system of claim 1, comprising a memory device having the memory array thereon, wherein the device configured to modify the soft-programming operation of the memory cells based on the charge accumulation in the plurality of memory cells comprises a processor external to the memory device.

11. A system comprising:
    a memory device, comprising:
      a non-volatile memory array: and
      a control circuit configured to modify a soft-programming operation based on a characteristic of an erase operation.

12. The system of claim 11, wherein the characteristic comprises a count of the number of pulses of the erase operation.

13. The system of claim 12, wherein the memory device comprises a state machine configured to store the count.

14. The system of claim 11, wherein the memory device comprises a flash memory device.

15. The system of claim 11, wherein the control circuit is configured to monitor the characteristic of a memory cell of the non-volatile memory array during the erase operation.

16. A system comprising:
   a memory device; and
   a processor coupled to the memory device and configured to modify a soft-programming operation based on a characteristic of an erase operation.

17. The system of claim 16, wherein the characteristic comprises a count of the number of pulses of the erase operation.

18. The system of claim 16, wherein the processor comprises a state machine configured to store the count.

19. The system of claim 16, wherein the memory device comprises a flash memory device.

20. The system of claim 16, wherein the processor is configured to monitor the characteristic of a memory cell of the non-volatile memory array during the erase operation.

* * * * *